United States Patent [19]

Schintlmeister et al.

[11] 3,958,070
[45] May 18, 1976

[54] DECORATIVE METALLIC ARTICLES WITH DIFFERENTLY COLORED SURFACE ZONES

[75] Inventors: Wilfried Schintlmeister, Reutte; Oskar Pacher, Muehl-Reutte, both of Austria

[73] Assignee: Schwarzkopf Development Corporation, New York, N.Y.

[22] Filed: June 10, 1974

[21] Appl. No.: 477,842

[30] Foreign Application Priority Data
June 22, 1973 Austria .............................. 5482/73

[52] U.S. Cl. ............................ 428/408; 428/209; 428/457
[51] Int. Cl.² ...................... C23C 29/00; C23D 5/06
[58] Field of Search............. 117/127, 37 R, 43, 44, 117/106 R, 106 C, 129; 428/209, 457, 408; 427/249, 321

[56] References Cited
UNITED STATES PATENTS

| | | | |
|---|---|---|---|
| 2,972,556 | 2/1961 | Vrahiotes et al. | 428/408 |
| 3,475,161 | 10/1969 | Ramirez | 117/127 |
| 3,717,496 | 2/1973 | Kieffer et al. | 117/127 |
| 3,854,991 | 12/1974 | Hale | 428/408 |

*Primary Examiner*—Mayer Weinblatt
*Assistant Examiner*—Edith R. Buffalow
*Attorney, Agent, or Firm*—Morgan, Finnegan, Pine, Foley & Lee

[57] ABSTRACT

A novel material is disclosed that is useful for the manufacture of durable metal articles which have differently colored surface zones.

11 Claims, No Drawings

DECORATIVE METALLIC ARTICLES WITH DIFFERENTLY COLORED SURFACE ZONES

BACKGROUND OF THE INVENTION

A need has been felt for a long time to render metal articles such as pieces of jewelry, for example, watch-cases, scratch- and corrosion resistant so that they retain their original appearance for a maximum length of time. It has been attempted, for example, to achieve superior scratch resistance by chromium-plating of watch-cases. However, a decisive improvement of these properties was not attained until cemented carbides were used in watch cases. Once the chemical and mechanical resistance had been attained, it was desired to give these watch-cases a more attractive appearance. This was achieved in part by making the watch-cases wholly of a metallic hard material having a gold-like color, as, for example, titanium nitride, tantalum nitride, zirconium nitride, etc., or the watch-cases were coated with colored hard materials, for example, the yellow titanium nitride or red titanium carbonitride. With this method, a single layer of a certain color was always deposited on the metallic substrate. Methods are also known today to equip metallic articles such as pieces of jewelry or watch cases with a decorative surface design formed of differently colored zones. A known method for the production of such a decorative design consists in coating the surface of the base body with metals such as titanium, tantalum, tungsten, vanadium, zirconium or hafnium and oxidizing different zones under different conditions. With suitable choice of these conditions, differently colored zones are produced. However, the coatings produced by this method have a low scratch and wear resistance. The present invention is intended to overcome these deficiencies.

It is a primary object of this invention to provide an article of jewelry, for example, a watch-case, having differently colored surface zones, wherein the differently colored surface zones are formed by hard materials of different chemical composition. As such hard materials, carbides, carbonitrides, nitrides, silicides or borides of the Group III to VI metals of the periodic table according to Mendeleef may be used, singly or in the form of solid solutions or mixtures, where metallic as well as non-metallic elements may be present.

DESCRIPTION OF THE INVENTION

The metal articles of this invention will comprise, in combination, a base member having on its surface at least one surface zone that is differently colored from the balance of said surface and is made of a hard material selected from the carbides, carbonitrides, silicides and borides of the elements of Groups III-VI of the Periodic Table of the Elements according to Mendeleef.

Examples of suitable hard materials which have particularly attractive colors include:

Titanium nitride — (yellow)
Zirconium nitride — (pale yellow)
Hafnium nitride — (yellow-brown)
Vanadium nitride — (pale yellow)
Tantalum carbide — (golden brown)
Niobium carbide — (light brown to violet)
Titanium carbonitride — (reddish golden to reddish violet to violet, depending on composition)
Zirconium carbonitride — (bronze to violet, depending on composition)
Niobium carbonitride — (up to pale violet with increasing carbon content)
Vanadium carbonitride — (pale yellow with high nitrogen content)
$LaB_6$ — (violet)
$LaB_{12}$ — (azure green)
$CeB_6$ — (blue violet)
$GdB_6$ — (blue)
LaN and CeN — (black)

Mixtures of hard materials or solid solutions of the same can also display special color effects and be suitable as coating materials. For example, a mixture of titanium carbide (20%) — titanium nitride (60%) — tantalum carbide (20%) has a bronze color. The surface zones may consist of hard materials without additions as well as of hard materials containing from a trace amount, e.g., 0.1 percent up to 30 volume percent of a softer binder metal or alloy, such as iron, nickel, cobalt, copper, titanium, chromium, molybdenum, tungsten and their mixtures and alloys etc. Such hard coatings may be polished to a bright finish and retain this polish for long periods because they are highly scratch and wear resistant and, in many cases, also highly corrosion resistant. The thickness of the individual layers forming the colored surface zones, should be between 0.1 and 30 m$\mu$, preferably between 0.5 and 10 m$\mu$.

Mechanically resistant metallic materials such as steel or cemented carbide alloys are suitable as base material for the new jewelry articles. Metal ceramic base materials containing metallic and non-metallic components or even purely ceramic materials such as alumina, may also be used. Furthermore, colored cemented carbides may be used as base material, i.e., cemented carbides consisting of colored hard materials or mixtures of solid solutions such as those used for coating purpose, and which are mixed with a suitable binder, for example, nickel, nickel-chromium or nickel-molybdenum alloys. When an adequately corrosion resistant and scratch-proof base material is used, for example, a corrosion-resistant cemented carbide alloy, the jewelry article in accordance with the invention may be of such a nature that it forms one of the surface zones so that one additional deposited zone is sufficient to form a decoration.

The deposition of the coating on the base material can be carried out by known methods such as flame and plasma spraying, sputtering, vacuum evaporation, etc. Particularly suitable for the production of the jewelry pieces in accordance with the invention, however, is the deposition from the gas phase. For example, layers of titanium nitride or titanium carbonitride can be deposited from gas mixtures by known methods; the gas mixtures contain hydrogen, titanium halogenides, gaseous hydrocarbons, nitrogen or nitrogen compounds and, if necessary, also noble gases. In order to produce a decorative design, the coatings may be deposited by zones, it being merely necessary to mask the parts of the surface which are not to be coated. When the coatings are deposited from the gas phase, where temperatures of 700°–1300°C are usually required, this method could place excessive demands on the masking materials. In this case, it may be preferable to produce the decoration by applying several coatings on top of each other and later to etch away part of these coatings. Chemical, electrochemical as well as mechanical and physical methods are suitable for removing these coatings. The chemical removal, for example, can be carried out with oxidizing acids or alkali containing oxidizers such as permanganates, ferric chloride, nitric acid, etc. The mechanical removal can be carried out by grinding, sand blasting or engraving, using very hard abrasives such as carborundum, boron carbide, diamond, etc. A physical method is sputtering or electron beam evaporation.

When chemical or electrochemical methods of material removal are used, the zones which are not to be removed may be protected with lacquers, resins, synthetic resins or with masks or patterns. A particularly advantageous method for the partial removal of coatings is the so-called photo-etching method. With this well known method, a synthetic resin coating is applied, which is sensitive to ultraviolet and then irradiated at the points where the coating is not to be removed so that the synthetic resin is cured at these points and becomes insoluble in the solvent used to remove the non-irradiated zones.

The surface zones, before or after the application of the decorative design, may be given a bright polish if desirable. This can be done by known methods, using adequately hard abrasives such as diamond paste, boron carbide or alumina. The invention will be illustrated by means of the following examples.

EXAMPLE 1

Production of a two-colored pattern on titanium carbide-cemented carbide watch-cases.

Watch-cases consisting of titanium carbide cemented carbide with a nickel-molybdenum binder are treated for an hour in a gas mixture consisting of titanium tetrachloride, hydrogen and nitrogen at 900°C, and subsequently, in a mixture of titanium tetrachloride, hydrogen, nitrogen and benzene for half an hour at 900°C. A coating consisting of a 6 m$\mu$ thick yellow titanium nitride layer and a 3 m$\mu$ thick violet titanium carbonitride layer is formed (70% titanium nitride and 30% titanium carbide in solid solution).

Masks with the desired pattern are placed on these watch-cases and an alkali-resistant lacquer is applied by means of a spray gun. Following removal of the masks, the watch-cases are placed in an aqueous solution containing 10% NaOH and 10% hydrogen peroxide, connected as the anode, and etched for one minute at a voltage of 20 V. The lower yellow coating is then exposed at the parts which has not been masked.

The watch-cases are then given a bright finish with alumina abrasive. The surface shows a two-colored pattern of yellow titanium nitride and violet titanium carbonitride.

EXAMPLE 2

Production of a coarse pattern on tungsten carbide watch-cases.

Watch-cases made of tungsten carbide-cobalt cemented carbide are coated as in embodiment 1. Masks with the desired pattern are placed on the coated cases and then sandblasted with carborundum (particle size 0.3–0.7 m$\mu$) until the lower, yellow coating is exposed. The cases are then again given a bright finish.

EXAMPLE 3

Production of a fine pattern of zirconium nitride-zirconium carbonitride hard materials on titanium carbide cemented carbide watch-cases.

Watch-cases of titanium carbide cemented carbide are coated for one hour in a gas mixture consisting of ZrCl$_4$, hydrogen and nitrogen for one hour at 1150°C and subsequently in a mixture of ZrCl$_4$, hydrogen, nitrogen and methane for half an hour at 1150°C. The coating consists of 5 m$\mu$ thick bright yellow zirconium nitride layer and above this, a 2 m$\mu$ thick red-violet zirconium cabonitride layer (50% zirconium carbide and 50% zirconium nitride solid solution). The application of the fine pattern is carried out by means of photo-etching.

An UV-sensitive lacquer (KMER, Kodak) is sprayed onto the coated watch-cases. After drying, a mask of a material which is opague to UV having the desired pattern is placed on the watch-case and this is irradiated for approximately ten minutes with UV (1000 W lamp). The watch-cases are then dipped in the developer which causes the non-irradiated parts of the lacquer to be removed. The cases are then etched with a mixture of concentrated nitric acid and 40% hydrofluoric acid (3:1), which causes the upper, red-violet layer to be etched away after 2 minutes, whereupon the yellow layer appears at the unmasked points. Subsequently, the residue of the protective lacquer is removed completely with a solvent and by wiping off. The watch-cases with the two-colored pattern, consisting of yellow zirconium nitride and red-violet zirconium carbonitride are then given a bright finish by polishing.

EXAMPLE 4

To place letters on a colored with hard material coated watch-case.

The watch-case of titanium carbide cemented carbide is coated as in Example 1 and then polished to a bright finish. A chemically resistant mask with cut-out letters is then placed on the watch. A porous electrode infiltrated with the etching compound indicated in Example 1 and which serves as a cathode is then placed on top. After two minutes etching at 15 V, the uppermost violet layer has been removed and the letters appear in the color of the layer underneath (yellow). If a bright finish is desired, the etched zone can be polished with fine-grained carborundum.

EXAMPLE 5

Production of two-colored watch-cases made of a carbonitride cemented carbide.

Watch-cases made of red-violet titanium carbonitride cemented carbide (titanium carbonitride solid solution containing 70% titanium nitride and 30% titanium carbide with 10 weight percent of a nickel-molybdenum binder) are coated for 3 hours at 820°C in a gas mixture consisting of TiCl$_4$, nitrogen and hydrogen. The coating has a thickness of 8 m$\mu$ and consists of the yellow titanium nitride. Following the coating operation, the yellow coating at the conical mantle surface of the watch-cases is ground off by means of a diamond wheel and the entire watch-case is given a bright finish by polishing. In this manner, a two-colored watch-case is obtained having a yellow layer on the red-violet base material.

EXAMPLE 6

Production of a tri-colored pattern of yellow titanium nitride, red titanium carbonitride and metallic-gray titanium carbide on a steel base.

Cuff-links of steel are coated for one hour at 920°C in a gas mixture consisting of titanium tetrachloride, nitrogen and hydrogen, then one hour in a gas mixture consisting of TiCl$_4$, nitrogen, benzene and hydrogen at 870°C, and then one hour in a gas mixture consisting of TiCl$_4$, hydrogen and benzene at 800°C. The innermost layer of the coating consists of yellow titanium nitride and has a thickness of 8 m$\mu$, the middle layer has a thickness of 4 m$\mu$ and consists of red titanium carbonitride (25% titanium carbide and 75% titanium nitride in solid solution) and the outer layer is 2 m$\mu$ thick and consists of metallic-gray titanium carbide.

The production of the pattern is carried out by means of photo-etching in the same manner as in Example 3. The pattern which should be of a red color is etched first. Subsequently, the pattern which should have a yellow color is etched. Following the repeated photo-etching the buttons are polished to a bright finish with alumina.

EXAMPLE 7

Production of a pattern on a yellow watch-case in a single operation.

Watch-cases of titanium nitride hard metal (titanium nitride with 10 weight percent of nickel-chromium binder) are coated with 2 m$\mu$ of red-violet zirconium carbonitride (50% ZrC and 50% ZrN in solid solution). The coating is carried out by means of sputtering.

During the coating operation the watch-case is covered with a mask containing the desired pattern so that the masked parts are not coated.

By means of the invention, it is possible to apply any desired type of decorative design, such as ornaments, drawings, patterns, lettering, etc. The invention is of course not limited to the preferred embodiments; jewelry articles of all types, such as, for example, cuff-links, rings, buckles, pendants, tie-pins, etc., can be made. Furthermore, articles of daily use, such as decorative metal articles for use on gunstocks, switch plates which are desired to have a pleasing appearance, may be wholly or in part equipped with a coating in accordance with the invention.

This invention has been described in detail with particular reference to preferred embodiments thereof, but it will be understood that variations and modifications can be effected within the spirit and scope of the invention as described hereinabove and as defined in the appended claims.

We claim:

1. An article of jewelry having differently colored surface zones, said metal article consisting essentially of a base member having on its surface at least one surface zone that is differently colored from the balance of said surface and is made of a hard material selected from the carbides, carbonitrides, silicides, nitrides and borides of the elements of Groups III–VI of the Periodic Table said differently colored surface zones being arranged so that they are in the form of a decorative pattern.

2. An article of jewelry as defined in claim 1 wherein at least one of the differently colored hard materials is selected from the group consisting of the carbides, carbonitrides, and nitrides of titanium and zirconium.

3. An article of jewelry as defined in claim 1 wherein at least one surface zone made of hard material contains up to 30 volume percent of a binder, said binder consisting essentially of a metal or a metal alloy that is softer than the hard material.

4. An article of jewelry as defined in claim 3 wherein the metal or metal alloys are selected from the group consisting of iron, nickel, cobalt, copper, titanium, chromium, molybdenum, tungsten and alloys thereof.

5. An article of jewelry as defined in claim 1 wherein the thickness of the differently colored surface zones is from 0.1 to 30 m$\mu$.

6. An article of jewelry as defined in claim 1 wherein the thickness of the differently colored surface zones is from 0.5 to 10 m$\mu$.

7. An article of jewelry as defined in claim 1 wherein said base member is metallic.

8. An article of jewelry as defined in claim 1 wherein said base member is a ceramic or a metal-ceramic.

9. An article of jewelry as defined in claim 1 wherein one of the surface zones is formed by the base material.

10. An article of jewelry as defined in claim 1 wherein said article of jewelry is a watch case.

11. An article of jewelry having differently colored surface zones, said metal article consisting essentially of a base member that is a colored cemented carbide which constitutes a first surface zone and a second surface zone that is differently colored from the first surface zone and consists essentially of a hard material selected from the carbides, carbonitrides, silicides, nitrides and borides of the elements of Groups III–VI of the Periodic Table, said differently colored surface zones being arranged so that they are in the form of a decorative pattern.

* * * * *